(12) United States Patent
Oikawa

(10) Patent No.: US 6,255,729 B1
(45) Date of Patent: Jul. 3, 2001

(54) MULTI CHIP PACKAGE (MCP) APPLICABLE TO FAILURE ANALYSIS MODE

(75) Inventor: Kiyoharu Oikawa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/476,085

(22) Filed: Jan. 3, 2000

(30) Foreign Application Priority Data

Jan. 13, 1999 (JP) .................................................. 11-006918

(51) Int. Cl.[7] .............................. H05K 7/20; H01L 27/10; H01L 21/46
(52) U.S. Cl. ............................ 257/723; 257/48; 257/203; 257/207; 257/210; 257/696; 257/698; 257/691; 257/686; 257/685; 257/692; 257/693
(58) Field of Search ................................. 257/678, 646, 257/692, 693, 696, 698, 723, 730, 772, 686, 685, 203, 207, 210, 48, 690, 691

(56) References Cited

U.S. PATENT DOCUMENTS

| | | | |
|---|---|---|---|
| Re. 36,077 | * 2/1999 | Michii et al. | ......................... 257/646 |
| 5,239,198 | * 8/1993 | Lin et al. | ............................... 257/693 |
| 5,646,422 | 7/1997 | Hashizume | .............................. 257/48 |
| 5,793,101 | * 8/1998 | Kuhn | .................................... 257/723 |
| 5,880,403 | * 3/1999 | Czajkowski et al. | ................. 257/713 |
| 5,994,166 | * 11/1999 | Akram et al. | ......................... 438/108 |
| 5,998,865 | * 12/1999 | Akram | .................................. 257/723 |
| 6,072,243 | * 6/2000 | Nakanishi | ............................. 257/686 |

* cited by examiner

*Primary Examiner*—Alexander O. Williams
(74) *Attorney, Agent, or Firm*—Oblon, Spivak, McClelland, Maier & Neustadt, P.C.

(57) ABSTRACT

An MCP has an MCP substrate, first and second semiconductor chips mounted on the MCP substrate, MCP leads connected to perimeter of the MCP substrate. MCP terminal wires disposed on the MCP substrate connect the MCP leads to the first semiconductor chip. Interface signal wires disposed on the MCP substrate connect the first and second semiconductor chips to each other. The MCP further has first and second extra bonding pads. The first extra bonding pad electrically connects to the interface signal wires. The second extra bonding pad electrically connects to the MCP leads. The second extra bonding pad is arranged near the first extra bonding pad. The first and second extra bonding pads are designed to be electrically isolated from each other in a normal usage condition. However, the first and second extra bonding pads are electrically connected to each other when failure analysis is required. Outputs from the port circuit and the MCP port circuit are inhibited by a control circuit mounted on the first semiconductor chip, so that a signal can be exchanged between the second semiconductor chip and an external circuit without using the first semiconductor chip. In this manner, the first and second extra bonding pads are electrically connected to each other, so that the second semiconductor chip can be analyzed, electrically independently of the first semiconductor chip.

20 Claims, 9 Drawing Sheets

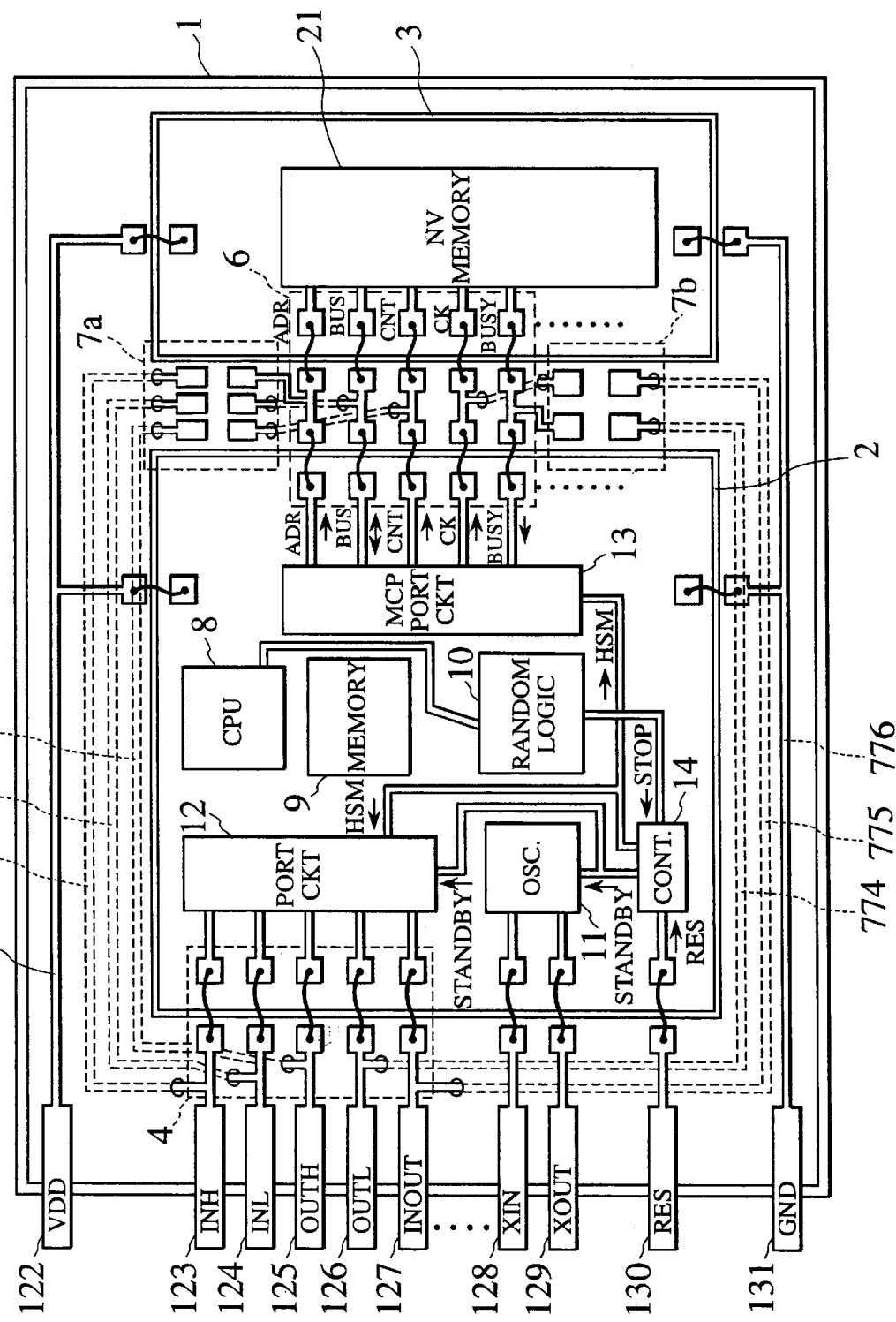

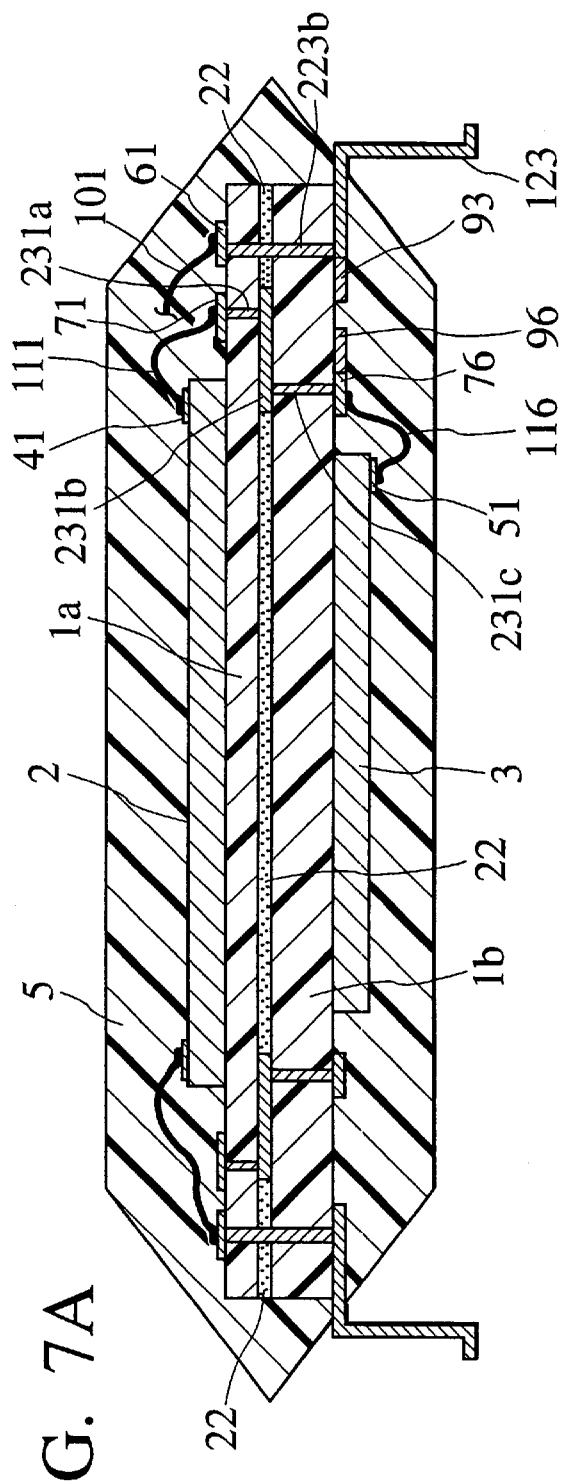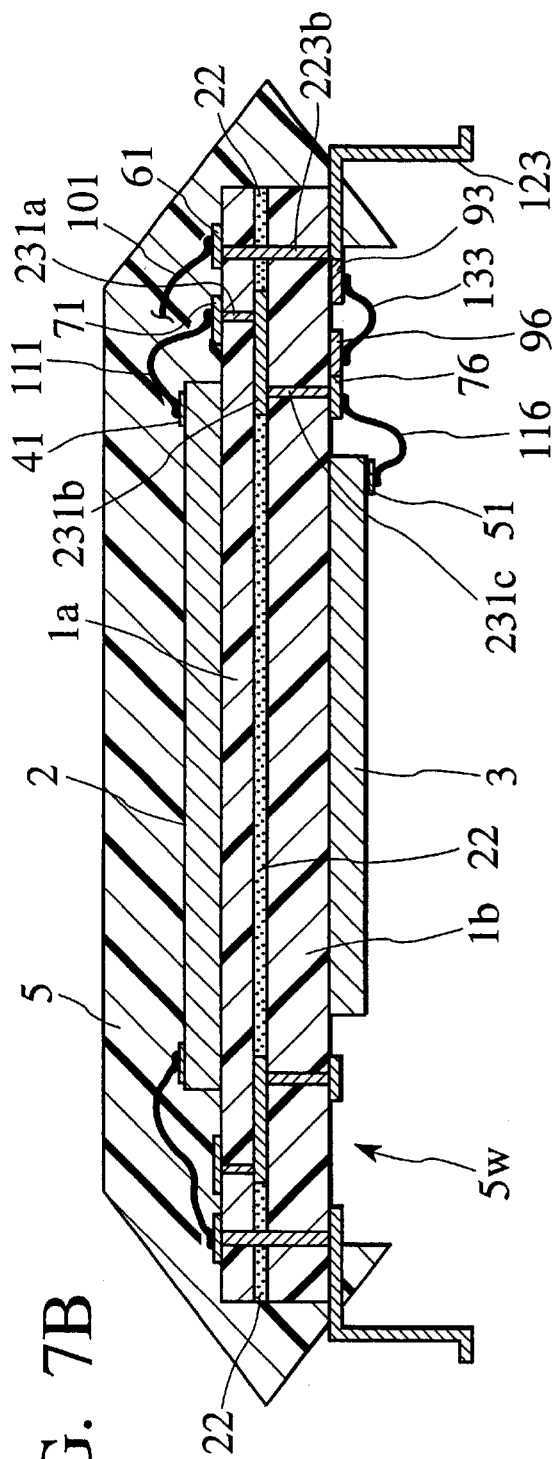

MULTI CHIP PACKAGE (MCP) APPLICABLE TO FAILURE ANALYSIS MODE

BACKGROUND OF THE INVENTION

1. Field of the Invention

The present invention relates to a multi chip package (MCP) in which first and second semiconductor chips are mounted on a same MCP substrate. In particular, the present invention relates to the MCP in which the second semiconductor chip can be diagnosed independently of the first semiconductor chip, and a method of measuring the electrical characteristics of the second semiconductor chip mounted on the MCP.

2. Description of the Related Art

In recent years, an MCP in which a CPU chip (first semiconductor chip) and an intellectual property (IP) chip (second semiconductor chip) are mounted on an MCP substrate has come to the front. The CPU chip serves as a main and pivotal control chip and configured to perform miscellaneous information processing. And the IP chip exchanges signals with the CPU chip to perform a specific function. In the MCP of this type, the number $N_{MCP}$ of pins of the MCP is limited by:

$$N_{MCP} = N_{CPU} - N_{IP} \tag{1}$$

Where $N_{CPU}$ is the number of pins of the CPU chip, and $N_{IP}$ is the number of pins of the IP chip. When the MCP is viewed from the outside, only the CPU chip can drive and access the IP chip. More specifically, in the conventional MCP, terminals configured such that the IP chip can directly exchanges signals with an external circuit are not formed. Therefore, in the conventional MCP, the IP chip cannot directly receive signals from the external circuit, nor CPU chip cannot directly feed signals to the external circuit without using the interconnections and internal circuitry formed on the CPU chip.

In this manner, in the conventional MCP, signals must be supplied to the IP chip through the CPU chip. Therefore, in qualification and failure analysis of mass-produced MCPs, it was complicated and troublesome tasks and very inconvenient to analyze IP chips mounted in MCPs when some failures or degradation are found. More specifically, an easy method or a convenient structure that appropriate signals are directly supplied to the IP chip, without using the paths on the CPU chip, so as to separately analyze the failure mode of the IP chip are unknown and cannot be implemented. Similarly, in commercial products, when a defective product is found, and when the IP chip in the defective MCP must be analyzed, the failure cite and failure mechanism, etc. of the IP chip cannot be independently analyzed in the conventional MCP. As a result, the failure of the IP chip cannot be precisely analyzed, and it is extremely difficult to assess the electrical behavior of the IP chip and to study the reason for the failures occurred in the IP chip. Then considerably longer time is required to diagnose and analyze the failure site and failure mechanism, etc. of the IP chip.

In particular, in order to separately measure and inspect the electrical characteristics of the IP chip, the MCP must be decapsulated so that the IP chip can be remounted on a specific lead frame designed for testing as a single chip. This procedure is a difficult operation, which requires the closest attention and sophisticated technique, and disadvantageously spends longer time. In addition, it is disadvantageous because accidents such that the IP chips are broken, fractured or damaged at the remounting stage of the IP chips onto the single chip lead frames sometimes occur.

SUMMARY OF THE INVENTION

The present invention has been made in consideration of the above problems of the MCP in which first and second semiconductor chips are mounted on an MCP substrate so that the second semiconductor chip is connected only to an external circuit through the first semiconductor chip under normal usage condition.

Then the present invention has an object to provide the MCP, but having a new structure in which the second semiconductor chip can be electrically analyzed in a short time, without employing signal paths running through the first semiconductor chip, only under the specific condition, to allow analyze separately the second semiconductor chip.

It is another object of the present invention to provide the MCP having a new structure configured such that the second semiconductor chip can be electrically analyzed independently of the first semiconductor chip at "failure analysis mode", directly supplying required signals to the second semiconductor chip from an external circuit.

It is another object of the present invention to provide a new method of measuring the electrical characteristics of a second semiconductor chip mounted in the MCP in which, when a degradation of manufacturing yield is found by the assessment of production management procedure, or when a failure or the like is found in a market usage, the defect or the failure of the second semiconductor chip can be easily analyzed in a short time.

It is still another object of the present invention to provide a new method of measuring the electrical characteristics of a second semiconductor chip mounted in the MCP, without requiring the conventional procedure of remounting the second semiconductor chip on a lead frame designed for a single chip testing, the new method being configured such that the second semiconductor chip is separately measured at "failure analysis mode" so as to prevent accidents such as fractures, deformations, or damages due to the complicated conventional remounting procedure.

In order to achieve the above object, a first feature of the present invention inheres in an MCP having: (a) an MCP substrate; (b) first and second semiconductor chips mounted on the MCP substrate; (c) MCP leads connected to perimeter of the MCP substrate; (d) MCP terminal wires for connecting the MCP leads to the first semiconductor chip; (e) interface signal wires for connecting the first and second semiconductor chips to each other; (f) a first extra bonding pad electrically connected to one of the interface signal wires; and (g) a second extra bonding pad electrically connected to one of the MCP leads and arranged near the first extra bonding pad. In this case, the connection between the MCP leads and the first semiconductor chip, the connection between the first and second semiconductor chips, or the connection between the first and second extra bonding pads may be performed by a wire bonding method, a tape automated bonding (TAB) method, or a flip chip bonding method, using solder bump (solder joint) or another conductive material bump.

In the MCP according to the first feature of the present invention, the first and second extra bonding pads may be electrically isolated from each other in a normal usage condition. The MCP has a control circuit and a structure in which the first and second extra bonding pads are electrically connected to each other in "a failure analysis mode", by which a failure or a defect is analyzed. More specifically, the first extra bonding pad and the second extra bonding pad are connected to each other, so that signal exchange between the second semiconductor chip and an external circuit without using the first semiconductor chip. As a result, the second semiconductor chip can be electrically independently analyzed, and an easy analysis and a reduction in analysis time can be achieved.

Furthermore, in an assessment of the second semiconductor chip except for the failure analysis, the second semiconductor chip can be diagnosed without requiring a single chip package assembly for mounting the second semiconductor chip. Then, the single chip lead frame employed by conventional method is not necessary, and the cost of the MCP can be reduced.

A second feature of the present invention inheres a method of measuring electrical characteristics of an IP chip mounted on an MCP substrate so as to form an MCP. The MCP substrate has MCP terminal wires, interface signal wires, first extra bonding pads electrically connected to the interface signal wires and second extra bonding pads electrically connected to the MCP terminal wires. And the MCP substrate is connected to MCP leads on perimeter of the MCP substrate. Further, the second extra bonding pads are electrically connected to the MCP leads through MCP terminal wires. That is, the method according to the second feature includes following steps: (a) mounting a CPU chip and the IP chip on the MCP substrate; (b) connecting MCP leads to the CPU chip through MCP terminal wires; (c) connecting the CPU chip and the IP chip through interface signal wires; (d) molding the CPU chip and the IP chip with a resin to constitute an MCP; (e) removing the resin; (f) electrically connecting first and second extra bonding pads; and (g) directly transmitting a signal from the MCP leads to the IP chip to measure the electrical characteristics of the IP chip.

In the second feature of the present invention, the first and second extra bonding pads are electrically isolated from each other under normal usage condition, and molding is performed with the resin to complete a product as the MCP. Thereafter, when a manufacturing yield assessed by product management procedure is found to be degraded, or when a failure or the like is generated in a market usage, the failure cite and the failure mechanism, etc. must be analyzed. In this "failure analysis mode", when the resin is removed, and when the first and second extra bonding pads are electrically connected to each other, failure analysis can be immediately executed. More specifically, the first extra bonding pad and the second extra bonding pad are connected to each other to make it possible to exchange signals between the IP chip and an external circuit without using the CPU chip. As a result, the IP chip can be electrically independently analyzed, and an easy analysis/diagnose and a reduction in analysis time can be achieved. In addition, since the IP chip needs not to be remounted on the single chip lead frame, accidents such as fractures, deformations, or damages of the IP chip or the like caused by the conventional remounting operation can be prevented.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 1A is a typical plan view showing the configuration of an MCP according to a first embodiment of the present invention.

FIG. 7A is a step sectional view along an I—I direction in FIG. 6A.

FIG. 7B is a sectional view for explaining a state in which semiconductor chips are connected in the optional bonding pad regions by using bonding wires on the both-side mounted MCP according to the second embodiment of the present invention.

DETAILED DESCRIPTION OF THE PREFERRED EMBODIMENTS

Figure 1B:
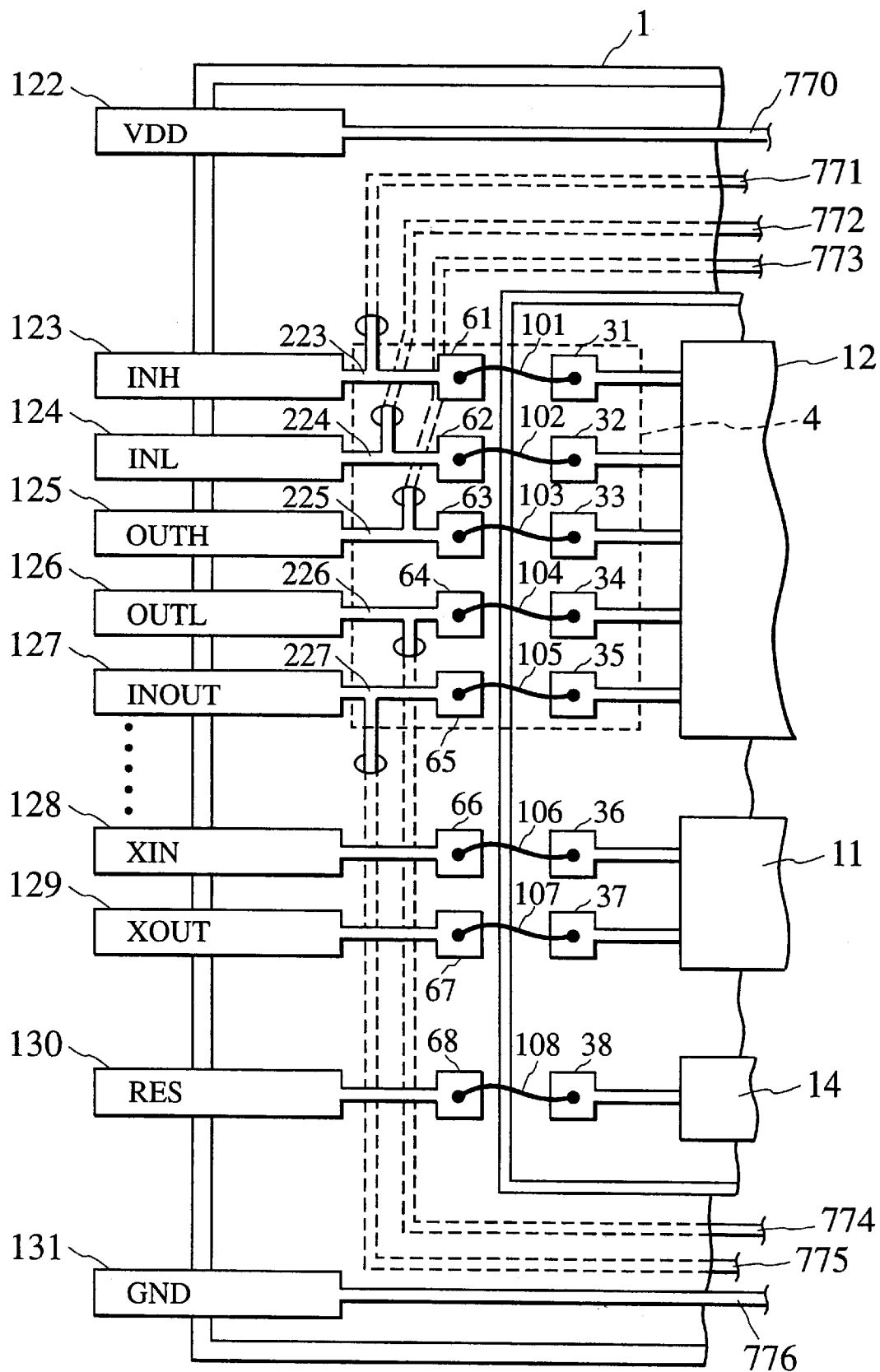
FIG. 1B is a typical enlarged plan view showing an MCP terminal wiring region in FIG. 1A and a peripheral portion around the MCP terminal wiring region.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following descriptions, numerous specific details are set fourth such as specific signal values, etc. to provide a thorough understanding of the present invention. However it will be obvious to those skilled in the art that the present invention may be practiced without such specific details.

(FIRST EMBODIMENT)

Figure 1C:
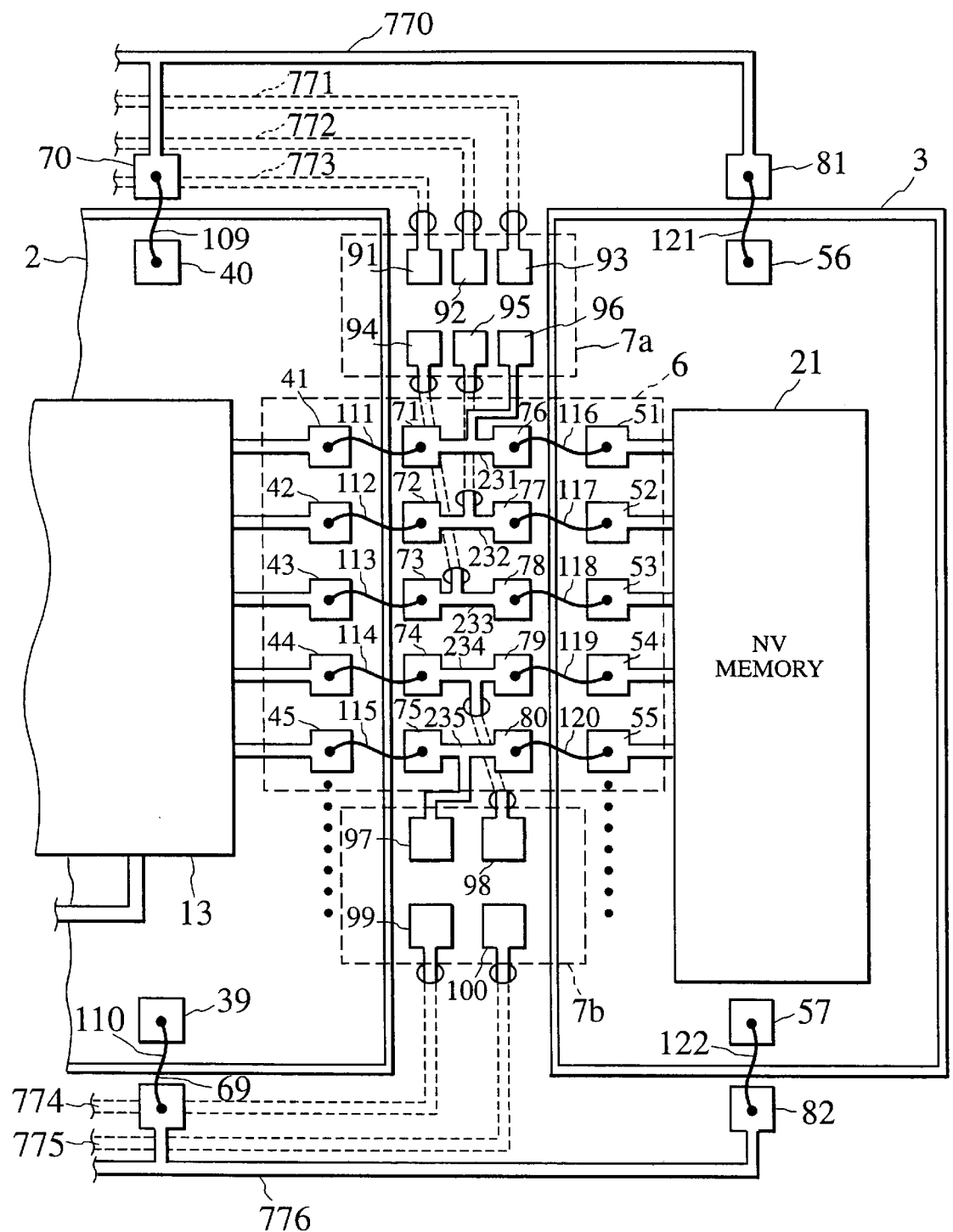
FIG. 1C is a typical enlarged plan view showing an interface signal wiring region in FIG. 1A, an optional bonding pad region, and peripheral portions around the interface signal wiring region and the optional bonding pad region.

As shown in FIGS. 1A, 1B, and 1C, an MCP according to the first embodiment of the present invention has: an MCP substrate 1; a first semiconductor chip 2 and a second semiconductor chip 3 mounted on the MCP substrate 1; MCP leads 123, 124, 125, 127, 126 connected to perimeter of the MCP substrate 1; MCP terminal wires 223, 224, ..., 227 for connecting the MCP leads 123, 124, 125, 127, 126 and the first semiconductor chip 2 to each other; interface signal wires 231, 232, ..., 235 for connecting the first semiconductor chip 2 and the second semiconductor chip 3 to each other; first extra bonding pads 94, 95, ..., 98 electrically connected to the interface signal wires 231, 232, ..., 235; and second extra bonding pads 91, 92, 93, 99, and 100 electrically connected to the MCP leads 123, 124, 125, 127, 126 and arranged near the first extra bonding pads 94, 95, ..., 98. The MCP substrate 1 has a laminated multi-layer structure composed of thin-film dielectric and metallization layers, in which buried interconnections 771, 772, ..., 775 are sandwiched. The surface of the MCP substrate 1 is coated with alumina ($Al_2O_3$).

More specifically, the CPU chip 2 serving as the first semiconductor chip and the IP chip 3 serving as the second semiconductor chip 3 are mounted on a same surface side of the MCP substrate 1. In order to input/output a signal to/from an external circuit and to supply a power supply voltage, the MCP substrate 1 has a group of input/output terminals (I/O leads) disposed on perimeter of the MCP substrate 1. The group of I/O leads include a high-level power supply (VDD) lead 122, the high-level input (INH) lead 123, a low-level input (INL) lead 124, a high-level (OUTH) lead 125, a low-level output (OUTL) lead 126, input/output (INOUT) leads 127, ..., a oscillator input (XIN) lead 128, a oscillator output (XOUT) lead 129, a reset (RES) lead 130, a ground (GND) lead 131, and the like. In the present invention, of these I/O leads, the high-level input (INH) lead 123, the low-level input (INL) lead 124, the high-level (OUTH) lead 125, the low-level output (OUTL) lead 126, and the input/output (INOUT) lead 127 are called "MCP leads 123, 124, 125, 127, 126".

The CPU chip (first semiconductor chip) 2 is a semiconductor chip, serving as a main and pivotal control chip, for performing information processing. The CPU chip 2 comprises a CPU 8, a memory 9, a random logic circuit 10, an oscillator 11, a port circuit 12, an MCP port circuit 13, a control circuit 14, and the like. The port circuit 12 is a circuit which interfaces a signal between the external circuit and the CPU chip 2 through the high-level input (INH) lead 123, the low-level input (INL) lead 124, the high-level (OUTH) lead 125, the low-level output (OUTL) lead 126, and the input/output (INOUT) lead 127. The MCP port circuit 13 interfaces a signal between the IP chip 3 and the CPU chip 2. The control circuit 14 controls the port circuit 12 and the MCP port circuit 13 on the basis of an external signal or an internal signal so as to inhibit their outputs, respectively. The oscillator 11 generates a system clock signal to be employed by the CPU 8.

On the other hand, the IP chip (second semiconductor chip) 3 is constructed of a nonvolatile memory 21 as shown in FIG. 1A. As the nonvolatile memory 21, a flash memory or the like is preferable. The IP chip 3 may be further added with an A/D converter, a digital signal processor (DSP), and the like. The IP chip 3 is accessed by the CPU chip 2, and exchanges a signal with the CPU chip 2 to perform a specific processing.

On the MCP substrate 1, an MCP terminal wiring region 4 is disposed adjacent to the CPU chip 2. The MCP terminal wiring region 4, as shown in FIG. 1B, has a group of terminal wires 223, 224, ..., 227 each having a T-shaped branch. The MCP terminal wires 223, 224, ..., 227 are disposed on the front principal surface of the MCP substrate 1 with a copper (Cu) thin film stripe having a width 25 μm to 100 μm and a thickness of 18 μm to 22 μm, and the surfaces of the MCP terminal wires 223, 224, ..., 227 are plated with nickel (Ni). The nickel-plated MCP terminal wires 223, 224, ..., 227 are further plated with gold (Au). First substrate site pads 61, 62, ..., 65 are disposed on the end portions of the MCP terminal wires 223, 224, ..., 227, respectively. The buried interconnections 771, 772, ..., 775 embedded in the MCP substrate 1 as a multi-level wiring structure are connected to the T-shaped branches of the terminal wires 223, 224, ..., 227 through holes, respectively. On the CPU chip 2, chip site pads 31, 32, ..., 35 connected to the port circuit 12 through aluminum (Al) wires are arranged. The chip site pads 31, 32, ..., 35 and the first substrate site pads 61, 62, ..., 65 are connected to each other through bonding wires 101, 102, ..., 105 consisting of gold (Au) wires each having a width of about 50 μm, respectively.

The CPU chip 2 and the IP chip 3 are connected to each other through an interface signal wiring region 6 disposed on the MCP substrate 1. The interface signal wiring region 6, as shown in FIG. 1C, has T-shaped branch wire 231 having a second substrate site pad 71 and a third substrate site pad 76 disposed at both the ends. Further the interface signal wiring region 6 has T-shaped branch wires 232, 233, 234, 235 each having second substrate site pad 72, 73, 74, 75 and third substrate site pads 77, 78, 79, 80 disposed at both ends. The T-shaped branch wires 231, 232, ..., 235, serving as the interface signal wirings, are made of copper (Cu) thin film patterns disposed on the surface of the MCP substrate 1, and each having a thickness of 18 μm to 22 μm. The surfaces of the T-shaped branch wires (interface signal wirings) 231, 232, ..., 235 are plated with nickel (Ni), and the nickel-plated T-shaped branch wires 231, 232, ..., 235 are further plated with gold (Au). Chip site pads 41, 42, ..., 45 connected to the MCP port circuit 13 through aluminum (Al) wires are disposed on the perimeter of the CPU chip 2. Chip site pads 51, 52, ..., 55 connected to the nonvolatile memory 21 through aluminum (Al) wires are disposed on the perimeter of the IP chip 3. The chip site pads 41, 42, ..., 45 and the second substrate site pads 71, 72, ..., 75 are connected to each other through bonding wires 111, 112, ..., 115 consisting of gold (Au) wires each having a diameter of about 50 μm, respectively. The chip site pads 51, 52, ..., 55 and the third substrate site pads 76, 77, ..., 80 are connected to each other through bonding wires 116, 117, ..., 120 consisting of gold (Au) wires each having a diameter of about 50 μm, respectively.

In addition, the MCP according to the first embodiment further has optional bonding pad regions 7a and 7b adjacent to the interface signal wiring region 6. The optional bonding pad region 7a has second extra bonding pads 91, 92, ..., 96, and the optional bonding pad region 7b has first extra bonding pads 97, 98, 99, 100. The T-shaped branch wire 231 in the interface signal wiring region 6 is connected to the first extra bonding pad 96. The T-shaped branch wires 232, 233, and 234 are connected to the first extra bonding pads 95, 94, and 98 through buried interconnections embedded in the MCP substrate 1 as a multi-level wiring structure, respectively. In addition, the T-shaped branch wire 235 is connected to the first extra bonding pad 97. In addition, the second extra bonding pads 91, 92, and 93 are connected to the buried interconnections 771, 772, and 773 embedded in the MCP substrate 1 as a multi-level wiring structure, and the second extra bonding pads 99 and 100 are connected to the buried interconnections 774 and 775, respectively.

Figure 2:
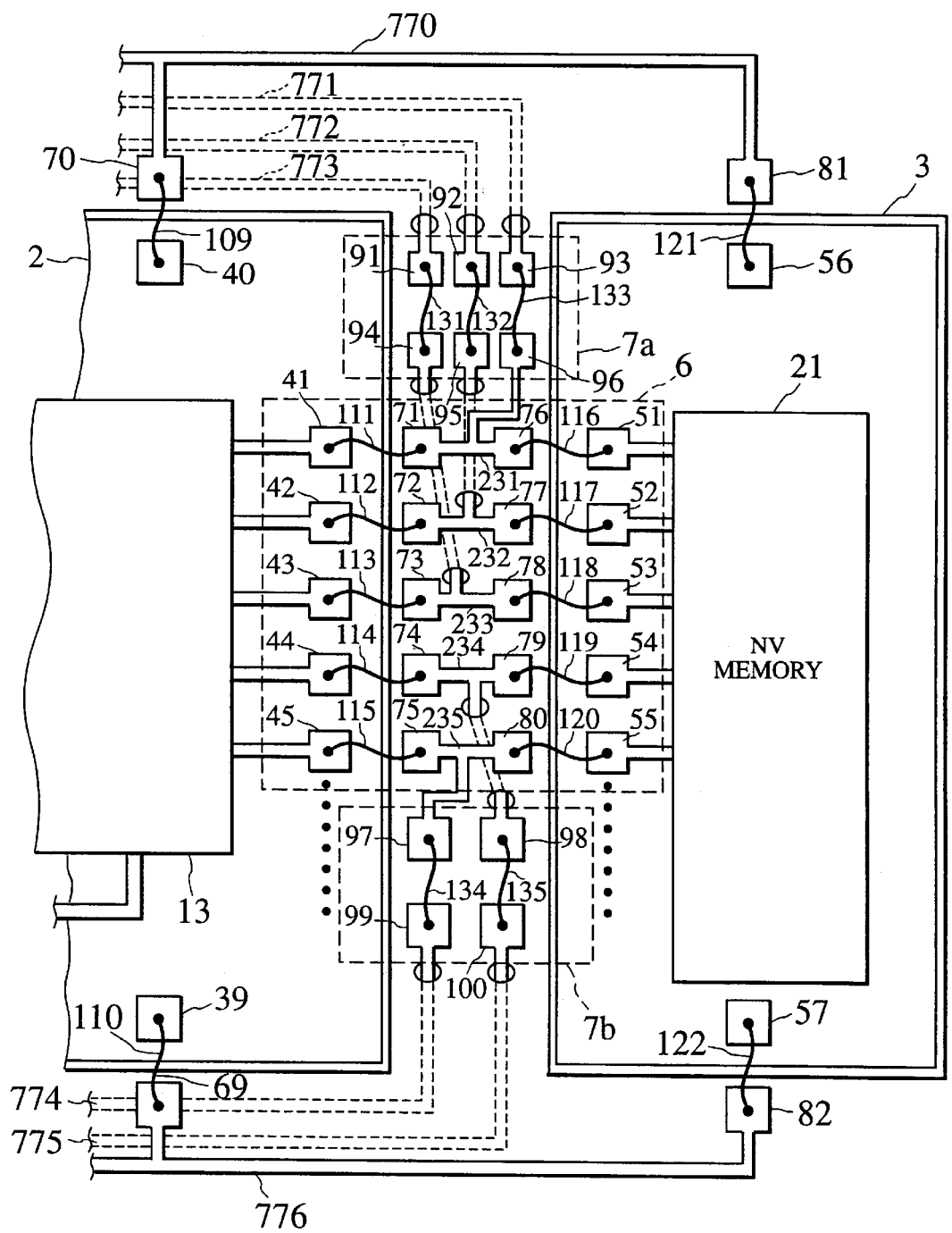
FIG. 2 is a plan view for explaining a state in which corresponding extra bonding pads are connected to each other by using bonding wires in the optional bonding pad region.

If a defect, a failure or the like happens to occur in the MCP according to the first embodiment, in the optional bonding pad regions 7a and 7b, the first and second extra bonding pads are mutually connected by using bonding wires, such as gold (Au) wires, each having a diameter of about 50 µm, respectively. Then it become possible to electrically independently analyze the failures occurred in the IP chip 3. More specifically, as shown in FIG. 2, the second extra bonding pad 91 and the first extra bonding pad 94 are connected to each other through the bonding wire 131, the second extra bonding pad 92 and the first extra bonding pad 95 are connected to each other through a bonding wire 132, and the second extra bonding pad 93 and the second extra bonding pad 96 are connected to each other through the bonding wire 133. The first extra bonding pad 97 and the second extra bonding pad 99 are connected to each other through a bonding wire 134, and the first extra bonding pad 98 and the second extra bonding pad 100 are connected to each other through a bonding wire 135. As a result, the MCP terminal wiring region 4 and the interface signal wiring region 6 are connected to each other through the buried interconnections 771, 772, 774, and 775 embedded in the MCP substrate 1 as a multi-level wiring structure. As shown in FIG. 2, in the optional bonding pad regions 7a and 7b, corresponding extra bonding pads are connected to each other by a known wire bonding method, predetermined signals can be directly supplied from an external circuit to the IP chip 3 without using the CPU chip 2. Wire bondings in the optional bonding pad regions 7a and 7b are not conducted for another object than the analysis of the IP chip 3.

Figure 3:
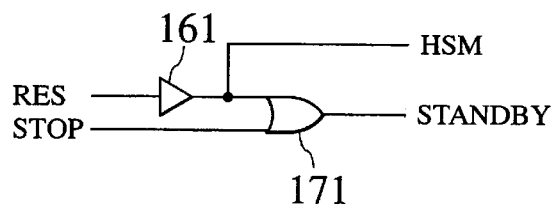
FIG. 3 is a circuit diagram showing the configuration of the control circuit shown in FIG. 1A.

The control circuit 14, as shown in FIG. 3, is constituted by a buffer amplifier 161 and an OR gate 171. The buffer amplifier 161 connects its input terminal to a reset signal wire, and connects its output terminal to the port circuit 12 and the MCP port circuit 13 as shown in FIG. 1A. An OR gate 171 connects its first input terminal to the output terminal of the buffer amplifier 161, connects its second input terminal to the random logic circuit 10, and its output terminal to the oscillator 11 and the port circuit 12.

When a defect or a failure of the IP chip 3 must be analyzed, a reset signal (RES) is supplied from an external circuit to the reset terminal 130 of the MCP according to the first embodiment. When the buffer amplifier 161 receives the reset signal (RES) supplied from the external circuit, the buffer amplifier 161 outputs a Hardware Standby Mode (HSM) signal to the port circuit 12 and the MCP port circuit 13. In addition, when the OR gate 171 receives the reset (RES) signal, the OR gate 171 outputs a "STANDBY" signal to the oscillator 11 and the port circuit 12. As a result, the port circuit 12, the MCP port circuit 13, and the oscillator 11 are in a "disable" state to set the IP chip 3 in a failure analysis mode. When the control circuit 14 receives a stop signal (STOP) given from the random logic circuit 10, the control circuit 14 outputs the "STANDBY" signal from the OR gate 171 to the oscillator 11 and the port circuit 12 to set the oscillator 11 and the port circuit 12 in a "disable" state and to set the MCP in a "failure analysis mode". More specifically, even if no reset signal (RES) is supplied to the reset terminal 130, the MCP can be set in the "failure analysis mode" by a stop signal (STOP) generated by the internal circuit of the CPU chip 2. In this manner, even either one of the case in which the reset signal (RES) from the external circuit is received and the case in which the stop signal (STOP) generated by the internal circuit of the CPU chip 2 is received, in the first embodiment, the MCP is set into the "failure analysis mode", and the IP chip 3 can be electrically independently measured and analyzed.

Figure 4:
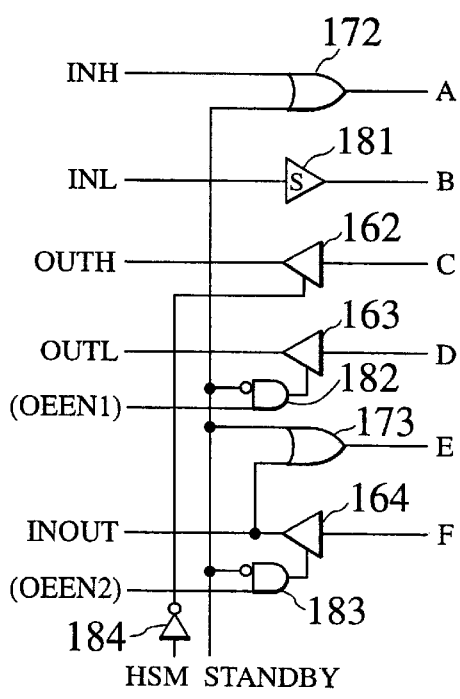
FIG. 4 is a circuit diagram showing the configuration of a port circuit shown in FIG. 1A.

The port circuit 12 is constituted by logic circuits such as a clock buffers 162, 163, and 164, an inverter (NOT gate) 184, AND gates 182 and 183, an OR gate 173, and a Schmitt trigger buffer circuit 181. Although the detailed description is omitted, in FIG. 4, reference symbols "A", "B", "C", "D", "E", and "F" denote signals used in the whole system. When the port circuit 12 receives an "HSM" signal at "high" level from the control circuit 14, the port circuit 12 causes the inverter (NOT gate) 184 to invert the "HSM" signal, and an output "OUTH" of the clock buffer 162 is inhibited by using the inverted "HSM" signal as a clock signal. In this manner, in a "failure analysis mode" of the IP chip 3, an output is inhibited from the CPU chip 2 to the high-level output (OUTH) lead 125. When "HSM" signal output from the control circuit 14 is "Low" level, the signal "C" used in the whole system is output to the high-level (OUTH) lead 125.

When the "STANDBY" signal output from the control circuit 14 is "High" level, the inverted signal of the "STANDBY" signal are input to one input terminal of each of the AND gates 182 and 183. When a signal "OEEN1" generated inside the port circuit 12 is input to the other input terminal of each of the AND gates 182 and 183, the clock buffers 163 and 164 inhibit outputs "OUTL" and "INOUT" of the clock buffers 163 and 164 by using the output signals from AND gates 182 and 183 as clock signals. When the "STANDBY" signal output from the control circuit 14 is "Low" level, the signals "D" and "F" used in the whole system are output to the low-level output (OUTL) lead 126 and the input/output (INOUT) lead 127, respectively. An OR gate 172 outputs a logical AND of a high-level input (INH) from the high-level input (INH) lead 123 and the "STANDBY" signal from the control circuit 14 as the signal "A" to used for the whole system. The Schmitt trigger buffer circuit 181 is a circuit having hysteresis characteristics. The Schmitt trigger buffer circuit 181 removes a noise component included in the low level input (INL) signal from the low-level input (INL) lead 124 to output the resultant signal as the signal "B" to used for the whole system. The OR gate 173 outputs a logical AND between an output signal from the clock buffer 164 and the "STANDBY" signal from the control circuit 14 as the signal "E" to used for the whole system.

Figure 5:
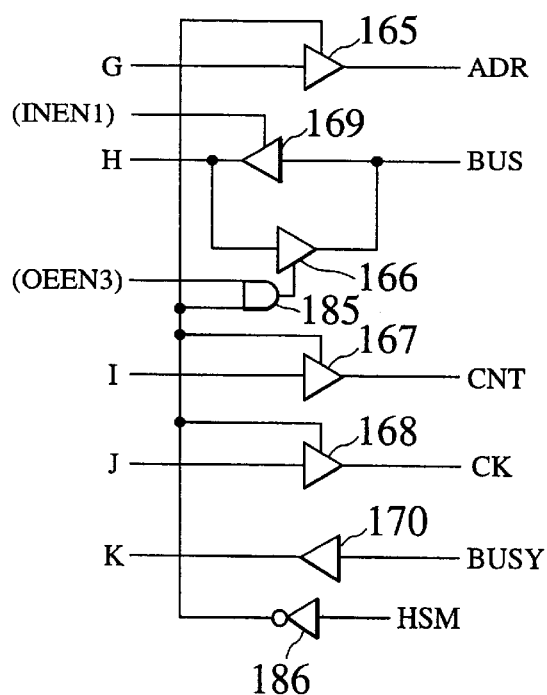
FIG. 5 is a circuit diagram showing the configuration of the MCP port circuit shown in FIG. 1A.

Similarly, the MCP port circuit 13, as shown in FIG. 5, is constituted by logic circuits such as clock buffers 165, 166, 167, and 168, an input clock buffer 169, an inverter (NOT gate) 186, an AND gate 185, and a buffer amplifier 170. When the MCP port circuit 13 receives the "HSM" signal at "High" level from the control circuit 14, the MCP port circuit 13 causes the inverter 186 to invert the HSM signal. Outputs from the clock buffers 165, 166, 167, and 168 are inhibited by using the inverted "HSM" signal as a clock signal. As a result, an IP chip address (ADR) signal, an IP chip control (CNT) signal, and an IP chip clock (CK) signal serving as outputs from the MCP port circuit 13 are inhibited. In this manner, in a "failure analysis mode" of the IP chip 3, an output from the CPU chip 2 to the IP chip 3 is inhibited. When the "HSM" signal output from the control circuit 14 is "Low" level, the signal "G" used in the whole system is output to the IP chip 3 through the clock buffer 165 as the address (ADR) signal for the IP chip. A signal "I" used in the whole system is output to the IP chip 3 through the clock buffer 167 as the control (CNT) signal for the IP chip. In addition, a signal "J" used in the whole system is output to the IP chip 3 through the clock buffer 168 as the clock (CK) signal for the IP chip.

The "HSM" signal inverted by the inverter 186 is input to one input terminal of the AND gate 185, a signal (OEEN3)

generated by the internal circuit of the MCP port circuit 13 is input to the other input terminal, and the clock buffer 166 is controlled by using the output signal as a clock signal. When the clock signal from the AND gate 185 is not input, the clock buffer 166 outputs a signal "H" used in the whole system to the IP chip 3 as the data bus (BUS) signal for the IP chip. On the other hand, the data bus (BUS) signal from the IP chip 3 outputs the signal "H" used in the whole system to the CPU chip 2 when the signal (IEEN1) generated by the internal circuit of the MCP port circuit 13 is not input to a clock buffer 169. The buffer amplifier 170 outputs a signal (BUSY) output from the IP chip 3 and informing that the IP chip 3 is busy to the CPU chip 2 as a signal used in the whole system.

In this manner, in the "failure analysis mode" of the IP chip 3, even if the CPU chip 2 is in an operation state, an IP chip address (ADR) signal, an IP chip control (CNT) signal, and an IP chip clock (CK) signal are not transferred from the CPU chip 2 to the IP chip 3.

As shown in FIG. 2, the second extra bonding pad 91 and the first extra bonding pad 94 are connected to each other through the bonding wire 131, the second extra bonding pad 92 and the first extra bonding pad 95 are connected to each other through the bonding wire 132, and the second extra bonding pad 93 and the second extra bonding pad 96 are connected to each other through the bonding wire 131. In this case, the IP chip address (ADR) signal, the IP chip data bus (BUS) signal, and the IP chip control (CNT) signal can be directly input to the IP chip 3 from the high-level input (INH) lead 123, the low-level input (INL) lead 124, and the high-level (OUTH) lead 125 through the buried interconnections 771, 772, and 773, respectively. When the first extra bonding pad 98 and the second extra bonding pad 100 are connected through the bonding wire 135 in FIG. 2, the IP chip clock (CK) signal can be directly input to the IP chip 3 from the input/output (INOUT) lead 127 through the buried interconnection 775. In addition, when the first extra bonding pad 97 and the second extra bonding pad 99 are connected through the bonding wire 134, a signal (BUSY) informing that the IP chip 3 is busy can be directly output to the low-level output (OUTL) lead 126. In this manner, an exchange of a signal between the external circuit and the IP chip 3 can be conducted directly, electrically independently from the performance of the CPU chip 2. Therefore, a failure mode of the IP chip 3 can be electrically independently analyzed from the outside without using the CPU chip 2. As a result, in a case that a reduction in yield in mass production of IP chips 3 is found, failure analysis of an IP chip can be immediately executed as a single chip, and a reduction in analysis time can be realized. When a defect or a failure is detected in a market, failure analysis of the IP chip 3 can be easily executed as a single chip without using the CPU chip 2, and a reduction in analysis time can be realized.

In evaluation of the IP chip 3 using a method other than the failure analysis, without using the dedicated package assembly of a single chip, the IP chip 3 can be evaluated by the MCP as it is according to the first embodiment. For this reason, in order to evaluate the IP chip 3, the conventional operation, by which the IP chip 3 had been removed from the MCP and been remounted onto another single chip lead frame, is not required. Namely, the single chip lead frame used in the conventional operation is not required. Therefore, the overall cost for packaging of the MCP can be reduced.

(SECOND EMBODIMENT)

Figure 6A:
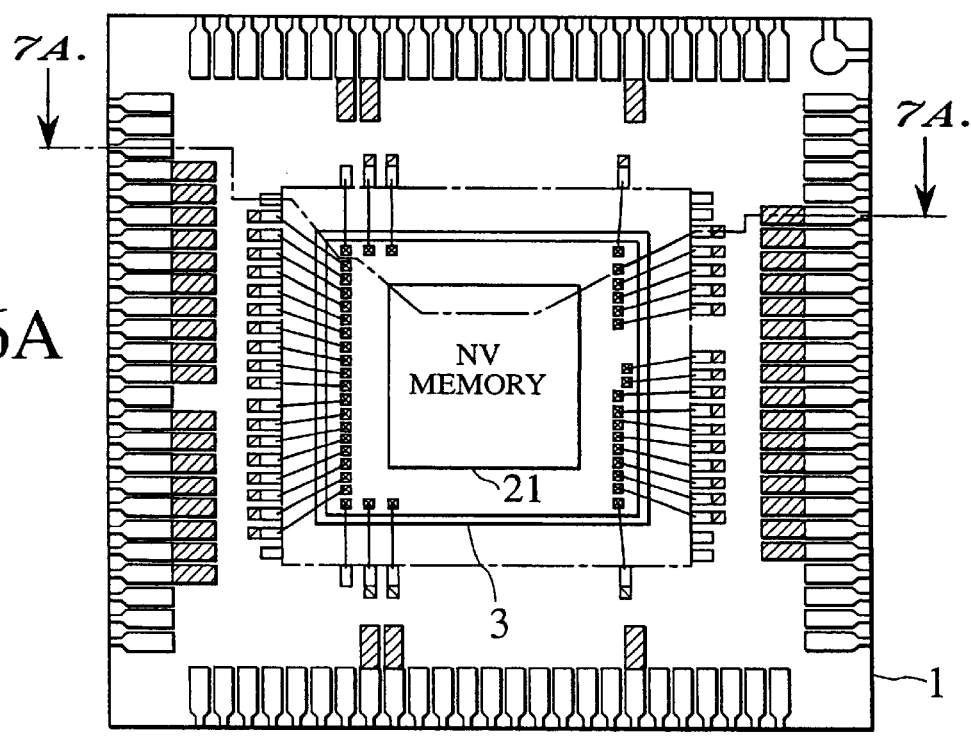
FIG. 6A is a typical plan view showing a packaging example of the rear principal surface of a both-side mounted MCP according to a second embodiment of the present invention.
Figure 6B:
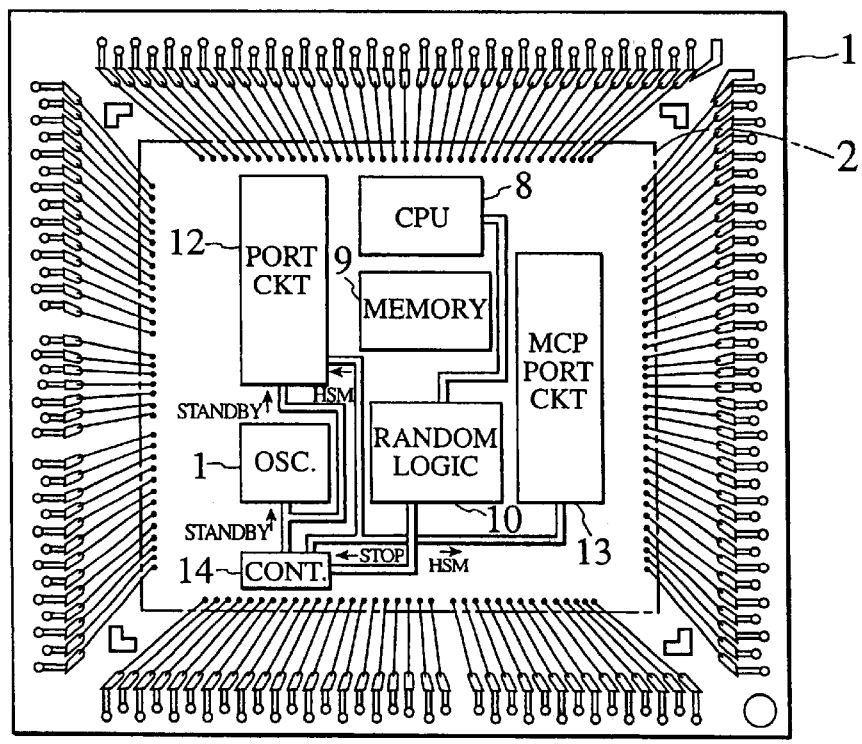
FIG. 6B is a typical plan view showing a packaging example of the front principal surface of the both-side mounted MCP according to the second embodiment of the present invention.

In the above first embodiment, the MCP having a structure in which the CPU chip (first semiconductor chip) 2 and the IP chip (second semiconductor chip) 3 are disposed on a same surface side (the same principal surface side) of the MCP substrate 1 has been explained. In an MCP according to a second embodiment of the present invention, as shown in FIG. 6B, the CPU chip 2 serving as the first semiconductor chip is mounted on the first principal surface (front principal surface) side of a MCP substrate 1, and a IP chip 3 serving as a second chip is mounted on the second principal surface (rear principal surface) side of the MCP substrate 1. Here, "the principal surface" means the surface having the largest area of a slab, or the MCP substrate 1. That is, the second principal surface (rear principal surface) and the first principal surface front principal surface) are major surfaces which are opposing to each other. As shown in FIG. 7A, the CPU chip (first semiconductor chip) 2 and the IP chip (second semiconductor chip) 3 are connected to each other through buried interconnections (231a, 231b, and 231c) embedded in the MCP substrate 1 to constitute a so-called "both-side mounted MCP".

More specifically, as shown in FIGS. 6A, 6B, 6C, and 7A, the MCP according to the second embodiment has the MCP substrate 1, the first semiconductor chip (CPU chip) 2, the second semiconductor chip (IP chip) 3, MCP leads 123, 124, 125, 127,126 connected to perimeter of the MCP substrate 1, MCP terminal wires 223b, . . . for connecting the MCP leads 123, 124, 125, 127,126 to the second semiconductor chip 2, interface signal wires for connecting the first semiconductor chip (CPU chip) 2 to the second semiconductor chip (IP chip) 3, second extra bonding pads 96, 95, 94, 98, 97 electrically connected to the interface signal wires, and second extra bonding pad 93, 92, 91, 100, 99 electrically connected to the MCP leads 123, 124, 125, 127,126. The second extra bonding pad 93, 92, 91, 100, 99 are opposing to the first extra bonding pads 96, 95, 94, 98, 97, respectively. And the second extra bonding pad 93, 92, 91, 100, 99 are arranged near to the first extra bonding pads 96, 95, 94, 98, 97. The MCP leads 123, 124, 125, 127,126 exchange signals with an external circuit, and supplies power supply voltages to the first semiconductor chip (CPU chip) 2 and the second semiconductor chip (IP chip) 3. As shown in the partially enlarged view in FIG. 6C, the MCP leads consist of a high-level input (INH) lead 123, a low-level input (INL) lead 124, a high-level (OUTH) lead 125, an input/output (INOUT) lead 127, and input/output (INOUT) lead 127 low-level output (OUTL) leads 126, . . . , and the like.

As shown in FIG. 7A, the MCP substrate 1 has a laminated multi-layer structure constituted by an upper substrate 1a and a lower substrate 1b. Buried interconnections are disposed between the upper substrate 1a and the lower substrate 1b, and the upper substrate 1a and the lower substrate 1b are adhered to each other by an adhesive layer 22. The front principal surface of the upper substrate 1a is coated with alumina ($Al_2O_3$), and a front surface wiring layer is disposed on the front principal surface of the upper substrate 1a. The rear principal surface of the lower substrate 1b is also coated with alumina ($Al_2O_3$), and a rear surface wiring layer is disposed on the rear principal surface of the lower substrate 1b.

The CPU chip 2 mounted on the front principal surface side of the MCP substrate 1 as the first semiconductor chip, as shown in FIG. 6B, is constructed of a CPU 8, a memory 9, a random logic circuit 10, an oscillator 11, a port circuit 12, an MCP port circuit 13, a control circuit 14, and the like. On the other hand, the IP chip 3 mounted on the rear principal surface side of the MCP substrate 1 as the second semiconductor chip, as shown in FIG. 6A, has a nonvolatile memory 21. The IP chip 3 may be added with an A/D converter, a DSP and the like. The IP chip 3 is accessed by the CPU chip 2 on the front principal surface, and exchanges a signal with the CPU chip 2 to perform a specific processing.

Figure 6C:
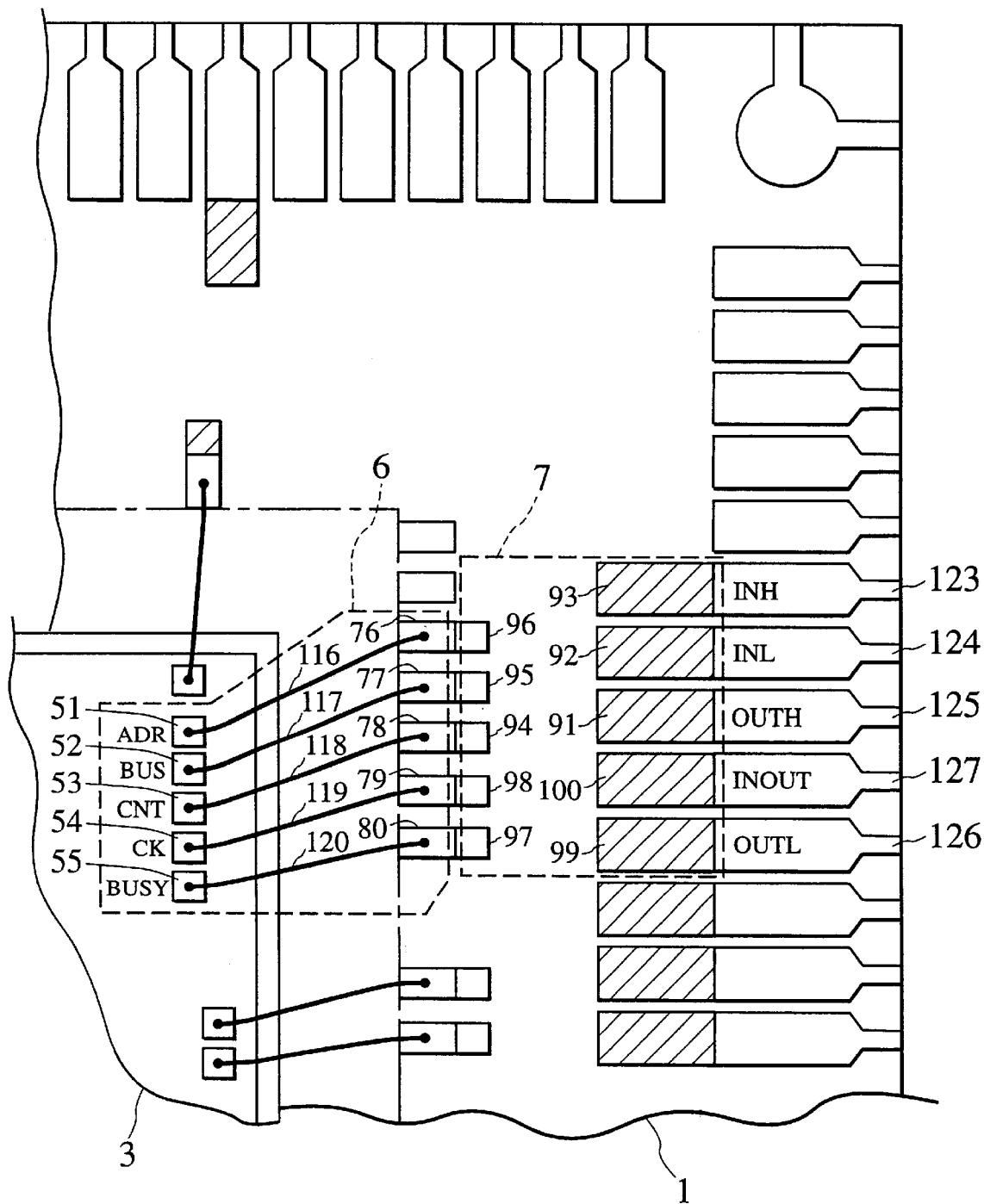
FIG. 6C is a typical enlarged plan view showing an interface signal wiring region in FIG. 6A, an optional bonding pad region, and peripheral portions around the interface signal wiring region and the optional bonding pad region.

The CPU chip 2 and the MCP leads 123, 124, 125, 127,126 are connected to each other through MCP terminal wires. The MCP terminal wires, as shown in FIG. 6C and FIG. 7A, are constituted by a first substrate site pad 61 and a first buried interconnection 223b. The first buried interconnection 223b connects the first substrate site pad 61 and an end portion of the MCP lead 123 to each other. The first substrate site pad 61 and a chip site pad (not shown in FIG. 7A) on the CPU chip 2 are connected to each other through a bonding wire 101 made of a gold (Au) wire having a diameter of about 50 μm. In the MCP according to the second embodiment, although the enlarged view showing the layout on the first principal surface side is omitted, the layout on the first principal surface side is the substantially same as that shown in FIG. 1B. Therefore, the destination, or the chip site pad, to which the bonding wire 101 is connected is not shown in FIG. 7A. However, as already shown in FIG. 1B, it is evident that the bonding wire 101 of FIG. 7A is similarly connected to the chip site pad 31. In addition, as in FIG. 1B, chip site pads 32, 33, 34, and 35 are disposed on the perimeter of the CPU chip 2. Therefore, in the second embodiment, as already shown in FIG. 1B, the chip site pads 31, 32, 33, and 34 are similarly connected to the first substrate site pads 62, 63, 64, and 65 through bonding wires 102, 103, 104, and 105, respectively.

The CPU chip 2 and the IP chip 3 are connected to each other through an interface signal wiring region 6 disposed on the MCP substrate 1. The interface signal wiring region 6, as shown in FIG. 6C and FIG. 7A, includes second substrate site pads 71, 72, . . . , 75 (See FIG. 1C) and third substrate site pads 76, 77, 78, 79, 80. The second substrate site pads 71, 72, . . . , 75 are constructed by front surface wiring layers disposed on the first principal surface. The third substrate site pads 76, 77, 78, 79, 80, are constructed by rear surface wiring layers disposed on the second principal surface. Further the second buried interconnection (231a, 231b, and 231c) is formed between the second substrate site pad 71 and the third substrate site pad 76. The second buried interconnection (231a, 231b, and 231c) serves as the interface signal wire of the present invention. With referring to FIG. 1C, we can imagine that another second buried interconnections are similarly formed between the second substrate site pads 72, 73, 74, 75 and the third substrate site pads 77, 78, 79, 80.

More specifically, as shown in FIG. 7A, a second buried interconnection 231b of the interface signal wiring region 6 is connected to the second substrate site pad 71 on the front principal surface through a connection metal 231a buried in a through hole, and is connected to the third substrate site pad 76 on the rear principal surface through a connection metal 231c buried in a through hole. And another second buried interconnections formed between the second substrate site pads 72, 73, 74, 75 and the third substrate site pads 77, 78, 79, 80 have the same structure. These another second buried interconnections serves as the interface signal wires of the present invention.

A chip site pad 41 on the CPU chip 2 and the second substrate site pad 71 are connected to each other through a bonding wire 111. Although not shown in FIG. 7A, as already shown in FIG. 1C, on the CPU chip 2, chip site pads 42, 43, 44, and 45 are similarly further arranged in the second embodiment. Therefore, the chip site pads 42, 43, 44, and 45 and the second substrate site pads 72, 73, 74, and 75 are similarly connected to each other through bonding wires 112, 113, 114, and 115, respectively. Although not shown, as in FIG. 1C, chip site pads 52, 53, 54, and 55 are similarly disposed on the IP chip 3 arranged in the second embodiment. As is apparent from FIG. 1C, the chip site pads 52, 53, 54, and 55 and third substrate site pad 77, 78, 79, and 80 are connected to each other through bonding wires 117, 118, 119, and 120, respectively.

In addition, the MCP according to the second embodiment, as shown in FIG. 6C, further has an optional bonding pad region 7 disposed adjacent to the interface signal wiring region 6. The optional bonding pad region 7 has first extra bonding pads 96, 95, 94, 98, and 97 and second extra bonding pads 93, 92, 91, 100, and 99. The first extra bonding pads 96, 95, 94, 98, and 97 are metallurgically connected to the third substrate site pad 76, 77, 78, 79, and 80, respectively. More specifically, each of the first extra bonding pads 96, 95, 94, 98, and 97 and the corresponding third substrate site pad 76, 77, 78, 79, and 80 merge into "double bonding pads", respectively, so as to form discrete integrated metal stripes made of the same material. The second extra bonding pads 93, 92, 91, 100, and 99 are metallurgically connected to the high-level input (INH) lead 123, the low-level input (INL) lead 124, the high-level (OUTH) lead 125, the input/output (INOUT) lead 127, and the low-level output (OUTL) leads 126, respectively. More specifically, each of the second extra bonding pads 93, 92, 91, 100, and 99 merges into corresponding MCP leads 123, 124, 125, 127,126, respectively, so as to form discrete integrated metal stripes made of the same material.

Next, a method of measuring the electrical characteristics of the IP chip 3 mounted in the MCP according to the second embodiment will be described below:

(a) At first, the CPU chip 2 and the IP chip 3 are mounted on the MCP substrate 1. As shown in FIGS. 6A, 6B, 6C and 7A, the MCP substrate 1 has MCP terminal wires 223b, . . . , interface signal wires (231a, 231b, and 231c), first extra bonding pads 96, 95, 94, 98, 97 electrically connected to the interface signal wires (231a, 231b, and 231c) and second extra bonding pads 93, 92, 91, 100, 99 electrically connected to the MCP terminal wires 223b, . . . , . And the MCP substrate is connected to MCP leads 123, 124, 125, 127,126 on perimeter of the MCP substrate 1. Further, the second extra bonding pads 93, 92, 91, 100, 99 are electrically connected to the MCP leads 123, 124, 125, 127,126 through MCP terminal wires 223b, . . . , .

(b) Then, the chip site pads 41, 42, 43, 44, and 45 disposed on the CPU chip 2 and second substrate site pads 71, 72, 73, 74, and 75 are connected to each other through the bonding wires 111, 112, 113, 114, and 115 by wire bonding method (See FIG. 1C). Further, the chip site pads 31, 32, . . . , 35 and the first substrate site pads 61, 62, . . . , 65 are connected to each other through bonding wires 101, 102, . . . , 105 by wire bonding method (See FIG. 1B). Then, the MCP leads 123, 124, 125, 127, 126 are connected to the CPU chip 2 through the MCP terminal wire 223b. . . and the first substrate site pads 61, 62, . . . , 65.

(c) In addition, the chip site pads 51, 52, 53, 54, and 55 on the IP chip 3 and the third substrate site pad 76, 77, 78, 79, and 80 are connected to each other through the bonding wires 116, 117, 118, 119, and 120, respectively by wire bonding method as shown in FIG. 6C. Then the CPU chip 2 and the IP chip 3 are connected through interface signal wires, or by the second buried interconnections formed between the second substrate site pads 71, 72, 73, 74, 75 and the third substrate site pads 76, 77, 78, 79, 80.

(d) Then, the CPU chip 2 and the IP chip 3 are molded and hermetically sealed with a resin 5 so as to form an MCP as shown in FIG. 7A.

(e) And when a reduction in yield in mass production is found, or when a failure of a product is found in a market, as shown in FIG. 7B, the resin 5 on top of the IP chip 3 is selectively removed to expose the optional bonding pad region 7. The hermetic package is opened either by mechanical means by using "a package opener", or by selectively and chemically melting the resin 5 employing mask to cover another resin sealing the CPU chip 2 on opposing side. The decapsulation can be accomplished by putting heated droplet of nitric acid and/or anhydrous sulfuric acid on the window part of the mask and letting the acid to eat its way down to the IP chip 3 through the mask. Once it reaches the surface of the IP chip 3, the masked package is dipped into nitric acid solution at room temperature to relax the chemical reaction. And the etching action is stopped by water flood. After rinsing and drying, the cross sectional structure, having window 5w exposing the optional bonding pad region 7, is obtained as shown in FIG. 7B.

Figure 8:
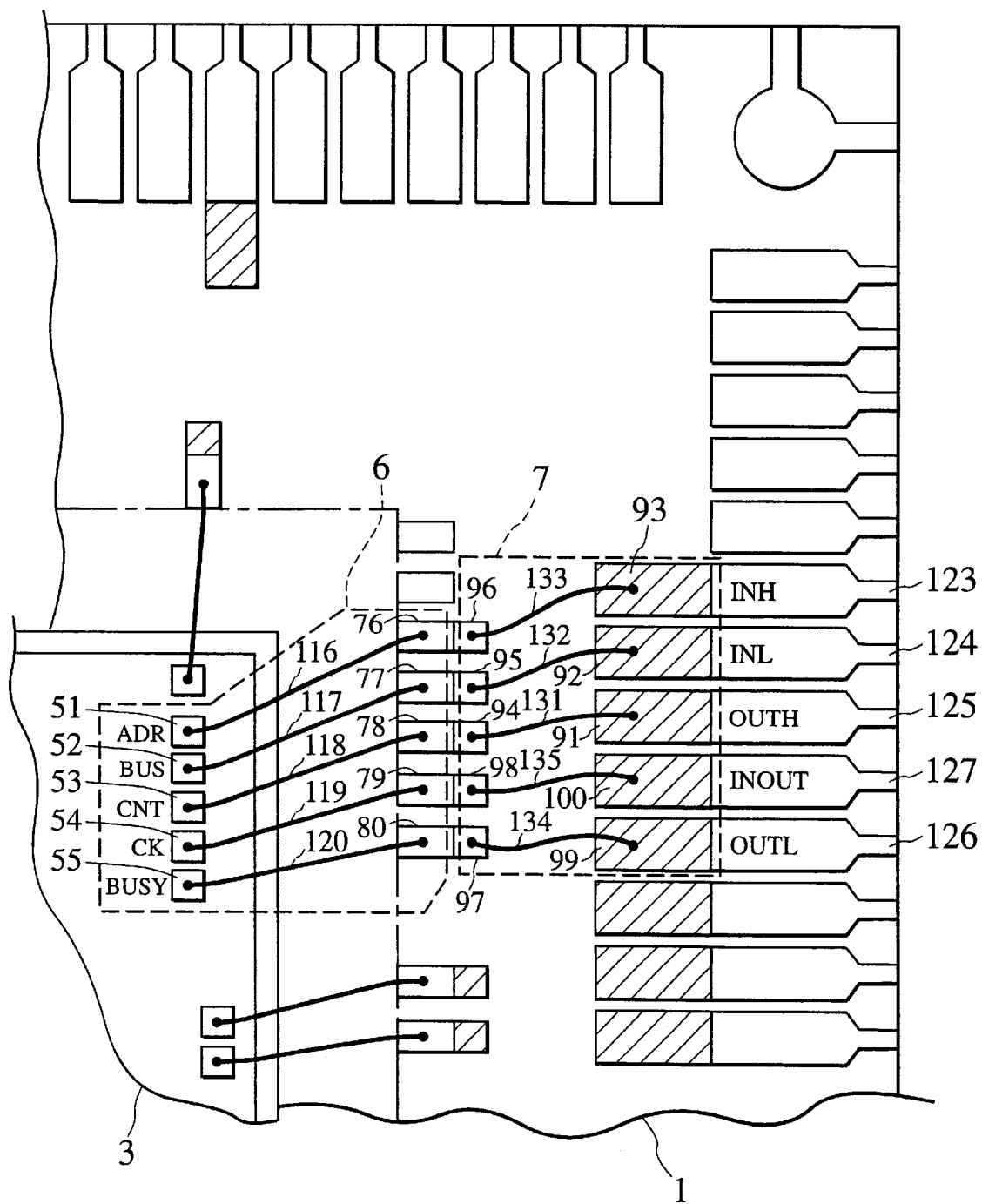
FIG. 8 is a plan view for explaining a state in which a semiconductor chip is connected in the optional bonding pad region by using bonding wires on the rear principal surface of the both-side mounted MCP according to the second embodiment of the present invention.

(f) Then through the window 5w, the first extra bonding pads 96, 95, 94, 98, 97 electrically connected to the interface signal wires and the second extra bonding pads 93, 92, 91, 100, 99 electrically connected to the MCP leads are electrically connected to each other. More specifically, as shown in FIG. 7B and FIG. 8, the second extra bonding pads 93 and the second extra bonding pad 96 are connected to each other through the bonding wire 131, the second extra bonding pad 92 and the first extra bonding pad 95 are connected to each other through the bonding wire 132, the second extra bonding pad 91 and the fist bonding pad 94 are connected to each other through the bonding wire 131, the first extra bonding pad 98 and the second extra bonding pad 100 are connected to each other through the bonding wire 135, and the first extra bonding pad 97 and the second extra bonding pad 99 are connected to each other through the bonding wire 134 by wire bonding method. As a result, the high-level input (INH) lead 123, the low-level input (INL) lead 124, the high-level (OUTH) lead 125, the input/output (INOUT) lead 127, the low-level output (OUTL) leads 126 are directly connected to the chip site pads 51, 52, 53, 54, and 55 on the IP chip 3, respectively. Wire bonding of the optional bonding pad region 7 is not performed for another reason than the failure analysis of the IP chip 3.

(g) In this manner, as shown in FIG. 7B and FIG. 8, when predetermined bonding pads are connected to each other in the optional bonding pad region 7 by the wire bonding method, signals can be directly supplied from an external circuit to the IP chip 3 without using the CPU chip 2. Then, the control circuit 14, the port circuit 12, the MCP port circuit 13, and the like, as in the MCP according to the first embodiment inhibit a signal from being output from the CPU chip 2 to the high-level (OUTH) lead 125 in "the failure analysis mode" of the IP chip 3. In addition, an IP chip address (ADR) signal, an IP chip control (CNT) signal, an IP chip clock (CK) and an IP chip data (BUS) signal are inhibited from being supplied from the CPU chip 2 to the IP chip 3. On the other hand, the IP chip address (ADR) signal, the IP chip data bus (BUS) signal, and the IP chip control (CNT) signal can be directly input from the high-level input (INH) lead 123, the low-level input (INL) lead 124, the high-level (OUTH) lead 125 to the IP chip 3. Further, an IP chip clock (CK) can be directly input from the input/output (INOUT) lead 127 to the IP chip 3. In addition, a signal (BUSY), informing that the IP chip 3 is busy, can be directly output to the low-level output (OUTL) lead 126. In this manner, an exchange of signals between the external circuit and the IP chip 3 can be conducted, electrically independently from the CPU chip 2. Namely, the external circuit can directly communicate with the IP chip 3. Therefore, signals are directly supplied from the MCP leads 123, 124, 125, 127,126 to the IP chip 3 to measure the electrical characteristics of the IP chip 3.

As described above, in the method of measuring the electrical characteristics of an MCP according to the second embodiment, Failures of the IP chip 3 can be electrically independently analyzed from the outside without using the CPU chip 2. As a result, when the reduction in yield in mass production of IP chips 3 is occurred, the failure analysis of the IP chip can be immediately executed as if the MCP is a single chip, and a reduction in analysis time can be realized. Or, when a defective product is found in a market, failure analysis of the IP chip 3 can be easily and quickly executed as if the MCP is a single chip, and the CPU chip 2 is set be electrically isolated from the IP chip 3, so that reduce the analysis time.

In the testing of the IP chip 3 having an object other than the above mentioned failure analysis, without using the conventional method to remount another dedicated package assembly of a single chip, the IP chip 3 can be evaluated as the both-side mounted MCP itself. For this reason, not only an operation which removes the IP chip 3 from the both-side mounted MCP and remounts the IP chip 3 onto a single chip lead frame is not required, but also the single chip lead frame itself is not required. Therefore, the cost for packaging of the both-side mounted MCP can be reduced.

(OTHER EMBODIMENTS)

Various modifications will become possible for those skilled in the art after receiving the teachings of the present disclosure without departing from the scope thereof.

Although the first and second embodiment have described the case in which the connection between the MCP lead and the first semiconductor chip, the connection between the first and second semiconductor chips, and the connection between the first and second extra bonding pads are performed by a wire bonding method, they are mere examples and another bonding methods can be employed. For example, at least a part of the connection between the MCP lead and the first semiconductor chip, the connection between the first and second semiconductor chips, and the connection between the first and second extra bonding pads may be implemented by a TAB method, or a flip chip bonding method, using solder bumps (solder bolls) or another conductive material bumps.

What is claimed is:

1. A multi chip package (MCP) comprising:

(a) an MCP substrate;

(b) a first semiconductor chip mounted on the MCP substrate having a control circuit configured to control signal transfer through the first semiconductor chip from an input of the first semiconductor chip to an output thereof;

(c) MCP leads connected to a perimeter portion of the MCP substrate and configured to receive signals from external circuits;

(d) MCP terminal wires disposed on the MCP substrate, said MCP terminal wires being configured to connect the MCP leads to the input of the first semiconductor chip so as to provide signals thereto;

(e) a second semiconductor chip mounted on the MCP substrate having a second semiconductor chip input to receive signals applied thereto;

(f) interface signal wires disposed on the MCP substrate and configured to connect the output from the first semiconductor chip to the input of the second semiconductor chip to provide for a normal mode transfer of signals between the first semiconductor chip and the second semiconductor chip;

(g) at least one first extra bonding pad disposed on the MCP substrate said at least one first extra bonding pad being electrically connected to at least one of the interface signal wires and further being normally electrically isolated from other electrical connections during the normal mode transfer of signals between the first semiconductor chip and the second semiconductor chip; and (h) at least one second extra bonding pad disposed on the MCP substrate, said second extra bonding pad being electrically connected to at least one of the MCP leads and arranged near the at least one first extra bonding pad and further being normally electrically isolated from other electrical connections during the normal mode transfer of signals between the first semiconductor chip and the second semiconductor chip and being connected to the at least one first extra bonding pad during a "failure analysis mode" so that a signal can be provided to the second semiconductor chip during the "failure analysis mode", wherein the control circuit inhibits the transfer of signals between the first semiconductor chip and the second semiconductor chip during the "failure analysis mode".

2. A semiconductor device including a multi chip package (MCP) comprising:

(a) an MCP substrate;

(b) first and second semiconductor chips mounted on the MCP substrate;

(c) MCP leads connected to a perimeter portion of the MCP substrate;

(d) MCP terminal wires disposed on the MCP substrate, said MCP terminal wires being configured to connect the MCP leads to the first semiconductor chip;

(e) interface signal wires disposed on the MCP substrate, said interface signal wires being configured to connect the first and second semiconductor chips to each other so as to transfer signals between the first and second semiconductor chips during a normal mode;

(f) at least one first extra bonding pad disposed on the MCP substrate and electrically connected to at least one of the interface signal wires; and (g) at least one second extra bonding pad disposed on the MCP substrate and electrically connected to at least one of the MCP leads and arranged near the first extra bonding pad, wherein the at least one first and at least one second extra bonding pads are configured to be electrically isolated from each other while signals are being transferred between the first semiconductor chip and the second semiconductor chip in the normal mode and the at least one first and at least one second extra bonding pads are electrically connected to each other during a "failure analysis mode".

3. The semiconductor device of claim 2, further comprising:

a port circuit disposed on the first semiconductor chip and connected to the MCP terminal wires;

an MCP port circuit disposed on the first semiconductor chip and connected to the interface signal wires; and a control circuit disposed on the first semiconductor chip and connected to the port circuit and the MCP port circuit, said control circuit being configured to control the port circuit and the MCP port circuit so as to inhibit output therefrom according to a signal provided by an external circuit or according to an internal signal generated by a circuit merged in the first semiconductor chip.

4. The semiconductor device of claim 2, wherein said first semiconductor chip is mounted on a first principal surface of the MCP substrate and said second semiconductor chip is mounted on a second principal surface of the MCP substrate, the second principal surface being opposed to the first principal surface.

5. The semiconductor device of claim 4, wherein said MCP leads are connected to a perimeter portion of the second principal surface.

6. The semiconductor device of claim 5, wherein said at least one first and at least one second extra bonding pads are disposed on the second principal surface.

7. The semiconductor device of claim 6, wherein said at least one second extra bonding pad is metallurgically connected to an end portion of said at least one of the MCP leads.

8. The semiconductor device of claim 7 wherein said at least one second extra bonding pad and said end portion of said at least one of the MCP leads are formed as an integrated metal stripe made of a same material.

9. The semiconductor device of claim 6, wherein said MCP terminal wires comprise:

first substrate site pads disposed on a perimeter portion of the first principal surface; and first buried interconnections embedded in the MCP substrate and configured to connect the first substrate site pads and end portions of the MCP leads to each other.

10. The semiconductor device of claim 9, wherein said interface signal wires comprise:

second substrate site pads disposed on the first principal surface;

third substrate site pads, wherein one of said third substrate site pads is metallurgically connected to said at least one first extra bonding pad and disposed on the second principal surface; and second buried interconnections embedded in the MCP substrate configured to connect the second and third substrate site pads to each other.

11. The semiconductor device of claim 10, wherein said at least one first extra bonding pad and at least one of the third substrate site pads are formed as an integrated metal stripe made of a same material.

12. The multi chip package of claim 1, further comprising:

a port circuit connected to the MCP terminal wires and disposed on the first semiconductor chip; and an MCP port circuit connected to the interface signal wires and disposed on the first semiconductor chip, wherein the control circuit is connected to the port circuit and the MCP port circuit and is further configured to control the port circuit and the MCP port circuit so as to inhibit output therefrom according to an inhibit signal given from an external circuit or according to an internal inhibit signal generated by a circuit merged in the first semiconductor chip.

13. The semiconductor device of claim 10, further comprising:

an oscillator connected to a control circuit, said oscillator and said control circuit being disposed on the first semiconductor chip;

a random logic circuit connected to the control circuit and also disposed on the first semiconductor chip; and a CPU connected to the random logic circuit and also disposed on the first semiconductor chip.

14. The semiconductor device of claim 13, further comprising:

a reset lead connected to the perimeter portion of the MCP substrate; and a reset signal wire for connecting the reset lead and the control circuit to each other.

15. The semiconductor device of claim 14, wherein said control circuit comprises:

a buffer amplifier having an input terminal connected to the reset signal wire and having an output terminal connected to the port circuit and the MCP port circuit; and an OR gate having a first input terminal connected to the output terminal of the buffer amplifier, having a second input terminal connected to the random logic circuit, and having an output terminal connected to the oscillator and the port circuit.

16. The semiconductor device of claim 15, wherein said port circuit comprises:

an inverter having an input terminal connected to the output terminal of the buffer amplifier; and a clock buffer operating with an output signal from the inverter as a clock signal.

17. The semiconductor device of claim 15, wherein said MCP port circuit comprises:

an inverter having an input terminal connected to the output terminal of the buffer amplifier; and a clock buffer operating with an output signal from the inverter as a clock signal.

18. The semiconductor device of claim 15, wherein said first semiconductor chip is configured to perform information processing, and said second semiconductor chip is an intellectual property chip configured to exchange signals with the first semiconductor chip so as to perform a specific processing.

19. The multi chip package of claim 1, further comprising resin encapsulating the MCP substrate, the first and second semiconductor chips, the MCP terminal wires, the interface signal wires, and the at least one first and at least one second extra bonding pads, wherein the resin provides the at least one first and at least one second extra bonding pads with electrical isolation from other electrical connections during the normal mode transfer of signals between the first semiconductor chip and the second semiconductor chip.

20. The multi chip package of claim 1, further comprising a buried interconnection configured to connect the at least one second extra bonding pad to the at least one of the MCP leads, the buried interconnection being embedded in the MCP substrate.

* * * * *